United States Patent [19]

Tigelaar et al.

[11] Patent Number: 4,827,323
[45] Date of Patent: May 2, 1989

[54] STACKED CAPACITOR

[75] Inventors: Howard L. Tigelaar, Allen; Bert R. Riemenschneider, Plano, both of Tex.

[73] Assignee: Texas Instruments Incorporated, Dallas, Tex.

[21] Appl. No.: 195,346

[22] Filed: May 12, 1988

Related U.S. Application Data

[60] Continuation of Ser. No. 932,801, Nov. 19, 1986, which is a division of Ser. No. 781,846, Jan. 7, 1986, Pat. No. 4,685,197.

[51] Int. Cl.$^4$ ............... H01L 29/78; H01L 27/02; H01L 23/48; H01G 4/06
[52] U.S. Cl. ............... 357/51; 357/23.6; 357/55; 357/71; 361/311; 361/313
[58] Field of Search ............... 357/23.6, 51, 55, 71; 361/311, 313

[56] References Cited

U.S. PATENT DOCUMENTS

| | | | |
|---|---|---|---|
| 3,519,901 | 7/1970 | Bean et al. | 357/51 |
| 4,017,885 | 4/1977 | Kendall et al. | 357/51 |
| 4,249,196 | 2/1981 | Durney et al. | 357/51 |
| 4,467,450 | 8/1984 | Kuo | 357/236 |
| 4,567,542 | 1/1986 | Shimada et al. | 357/51 |

FOREIGN PATENT DOCUMENTS

58-175855  10/1983  Japan ............... 357/51

*Primary Examiner*—Andrew J. James
*Assistant Examiner*—Donald J. Featherstone
*Attorney, Agent, or Firm*—Larry C. Schroeder; Leo N. Heiting; Melvin Sharp

[57] ABSTRACT

The present invention provides a structure and method for fabricating that structure which provides increased capacitance over the prior art while occupying a minimum of surface area of the integrated circuit. The present invention accomplishes this by interleaving multiple capacitor plates to provide increased capacitance while occupying the same surface area as a prior art capacitor providing a fraction of the capacitance provided by the present invention. The present invention is fabricated by providing a capacitor stack which includes interleaved plates of material which may be selectively etched and which is separated by appropriate dielectric material. One portion of the stack is masked while one set of the interleave plates is etched. The etched portion of the interleave plates is filled by a suitable dielectric and a contact is made to the remaining plates. A different portion of the stack is then exposed to an etch which etches the other set of interleave plates. The area etched away is then filled with a suitable dielectric and a contact is made to the unetched interleaved plates. Thus a fully interleaved capacitor is provided using relatively simple fabrication techniques while still providing increased capacitance.

11 Claims, 9 Drawing Sheets

STACKED CAPACITOR

FIELD OF THE INVENTION

This is a continuation of application Ser. No. 932,801, filed Nov. 19, 1986, which is a division of application Ser. No. 781,846, filed Jan. 7, 1986, now U.S. Pat. No. 4,685,197, issued Aug. 11, 1987.

The present invention relates to the field of integrated circuit fabrication. More specifically, the present invention relates to a structure and method for fabricating capacitors in integrated circuits.

BACKGROUND OF THE INVENTION

The fabrication of high capacitance capacitors in integrated circuitry has proven problematic. The problem is caused by competing goals in the fabrication of the capacitors. To provide maximum capacitance, maximum interface area between the two plates of the capacitor is necessary. However, to maximize the number of components in an integrated circuit a minimum of surface area of the integrated circuit must be used to fabricate each component. Prior art techniques have used vertical plate structures to try to provide the necessary interface area between the capacitor plates while using a minimum of surface area of the integrated circuit. However, even these vertical structures do not provide adequate capacitance.

SUMMARY OF THE INVENTION

The described embodiments of present invention provides a structure, and method for fabricating that structure, which provides increased capacitance over the prior art while occupying a minimum of surface area of the integrated circuit. The present invention accomplishes this by interleaving multiple capacitor plates to provide increased capacitance while occupying the same surface area as a prior art capacitor which provides a fraction of the capacitance provided by the present invention. The present invention is fabricated by providing a capacitor stack which includes interleaved plates of material which may be selectively etched and which are separated by appropriate dielectric material. One portion of the stack is masked while one set of the interleaved plates is etched. The etched portion of the interleave plates is filled by a suitable dielectric and a contact is made to the remaining plates. A different portion of the stack is then exposed to an etch which etches the other set of interleaved plates. The area etched away is then filled with a suitable dielectric and a contact is made to the unetched interleaved plates. Thus a fully interleaved capacitor is provided using relatively simple fabrication techniques while still providing increased capacitance.

DESCRIPTION OF THE DRAWING

FIGS. 3A through 3G are processing steps of another embodiment of this invention to provide another embodiment of the structure of this invention.

DETAILED DESCRIPTION

Figure 1A:
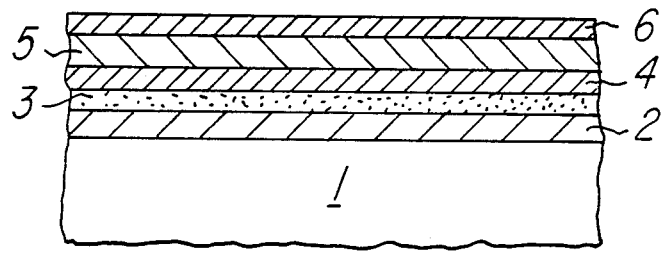
FIGS. 1A through 1G are side view schematic diagrams depicting the processing steps of this invention which provide one embodiment of the structure of this invention.

FIG. 1A through 1G are side view schematic diagrams depicting the processing steps of one embodiment of this invention used to fabricate a structure which is another embodiment of the present invention. As shown in FIG. 1A, dielectric layer 2 is formed on the surface of substrate 1 using techniques well known in the art such as chemical vapor deposition. Substrate 1 may be a crystalline silicon substrate so that other components well known in the art of integrated circuit manufacturing may be fabricated therein. Dielectric layer 2 may be any suitable dielectric such as silicon dioxide. Conductor layer 3 is formed on the surface of dielectric layer 2 using techniques well known in the art such as chemical vapor deposition. Conductive layer 3 is formed of a material such as molybdenum which may be selectively etched while not etching dielectric layer 2. Dielectric layer 4 is formed on the surface of conductive layer 3 using techniques well known in the art such as chemical vapor deposition. Dielectric layer 4 is a suitable dielectric such as silicon dioxide. Conductive layer 5 is formed on the surface of dielectric layer 4 using techniques well known in the art such as chemical vapor deposition. The material of conductive layer 5 is chosen so that conductive layer 5 may be selectively etched while not etching dielectric layers 2 and 4 and while not etching conductive layer 3. An example of such a material is doped polycrystalline silicon. Dielectric layer 6 is formed on the surface of conductive layer 5 using techniques well known in the art such as chemical vapor deposition to provide a nonconductive cap on the surface of conductive layer 5.

Figure 1B:
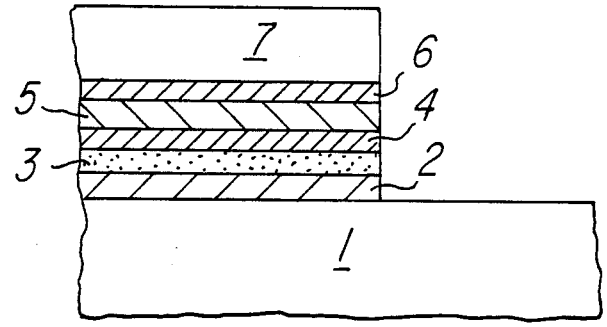

The present technique shows two conductive layers serving as capacitor plates. However, it is to be understood that the present method preferably provides multiple interleaved plates one on top of the other separated by dielectric material to provide increased capacitance. The depicted example is chosen as a relatively simple illustration of the technique of this invention. Referring now to FIG. 1B, photoresist layer 7 is formed on the surface of dielectric layer 6 and is patterned using techniques well known in the art. The pattern of photoresist layer 7 is used to etch dielectric layers 2, 4, and 6 and conductive layers 5 and 3 as shown in FIG. 1B. The structure of FIG. 1B is then subjected to an etchant which selectively etches conductive layer 5 while not etching dielectric layers 2, 4, and 6 and not etching conductive layer 3. Such an etch may be a liquid etch such as hydroflouric acid. Photoresist layer 7 may be partially etched as shown in FIG. 1C by this process.

Figure 1C:
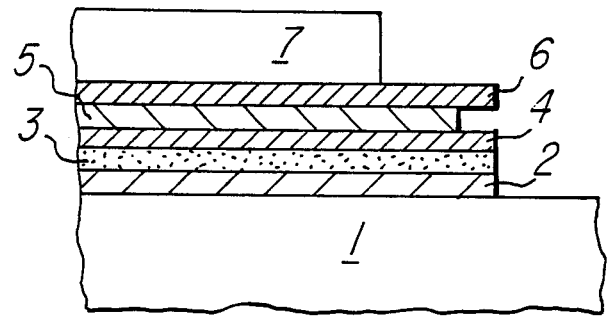
Figure 1D:
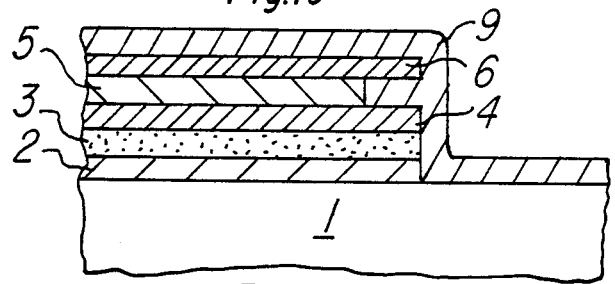
Figure 1E:
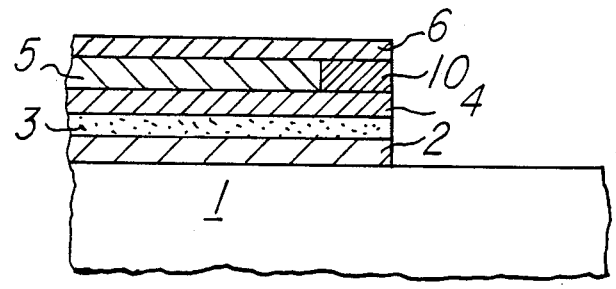
Figure 1F:
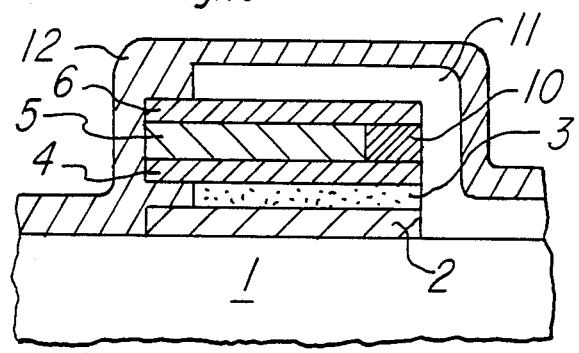
Figure 1G:
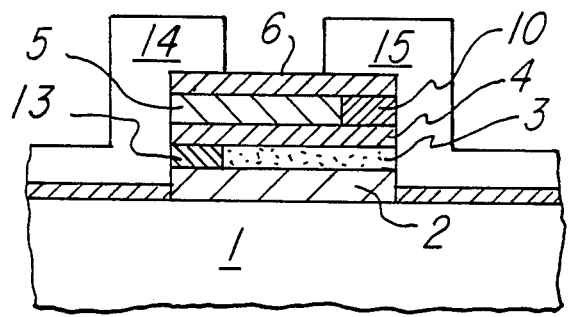

As shown in FIG. 1D, dielectric layer 9 is then formed on the surface of the structure of FIG. 1C. Dielectric layer 9 is preferably formed using a conformal technique such as chemical vapor deposition which fills the space left by etching conductive layer 5. The structure of FIG. 1D is then subjected to an anisotropic etching process which provides substantially vertical etching to remove dielectric layer 9 as shown in FIG. 1E. The remaining structure includes dielectric plug 10 which insulates conductive layer 5 from the right edge of the stack of conductive and dielectric materials. The steps described with regard to FIGS. 1A through 1E are then performed to form the left side of the stack as shown in FIG. 1E. The difference between the method used to form the right side of the stack and the left side of the stack is that the selective etching step used to etch conductive layer 5 on the right side of the stack is performed using a different etching chemical which selectively etches conductive layer 3, for example dilute nitric acid, so that dielectric layer 12 may fill the etched portion of dielectric layer 3 as shown in FIG. 1F. Dielectric layer 12 and photoresist layer 11 are then anisotropically etched so that dielectric plug 13 remains as shown in FIG. 1G. Conductive contacts 14 and 15 are then formed on either side of the capacitor stack using techniques well known in the art as shown in FIG. 1G. Contact 14 provides contact to conductive layer 5 which functions as one plate of the capacitor. Contact 15 provides contact to conductive layer 3 which serves as the opposing plate of the capacitor. It is to be emphasized again that the stack could contain any number of conductors separated by dielectric material making contact to contacts 14 and 15 in an opposing manner, thus providing an interleaved capacitor on the surface of a substrate suitable for the formation of integrated circuit devices providing increased capacitance over the structures and techniques for forming capacitors used in the prior art.

Other materials may be used to fabricate conductive layers 3 and 5. For example, conductive layer 3 may be aluminum and conductive layer 5 may be tungsten. Conductive layer 3 may then be selectively etched using a chlorine plasma and conductive layer 5 may be selectively etched using a flourine plasma.

Figure 2:
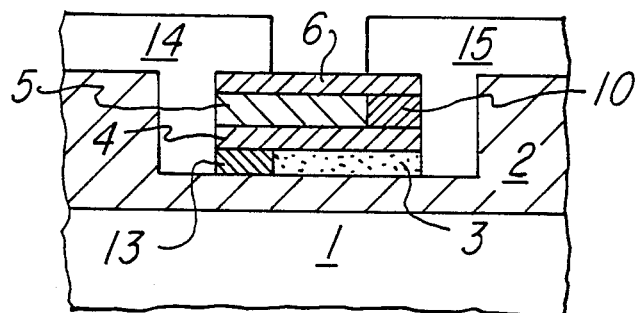
FIG. 2 is another embodiment of the present invention using a different plate contact scheme.

FIG. 2 is a side view schematic diagram depicting another embodiment of the present invention which includes additional dielectric material formed on the surface of dielectric layer 2 thus providing a thicker dielectric layer and causing the surface of contacts 14 and 15 to be substantially coplanar. The structure of FIG. 2 minimizes the problems of step coverage and electromigration of conductive leads which may be formed on top of capacitor 20.

Figure 3A:
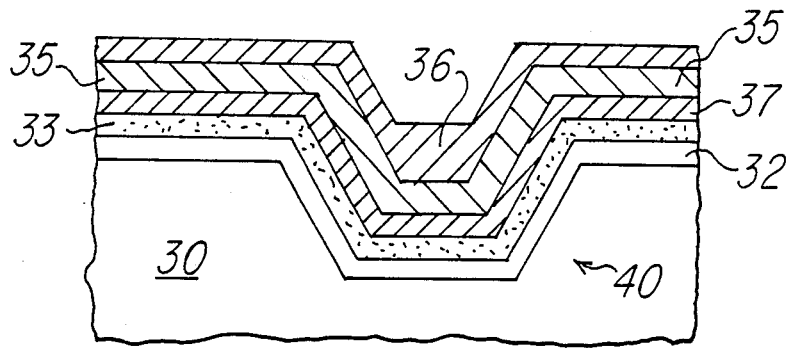
Figure 3B:
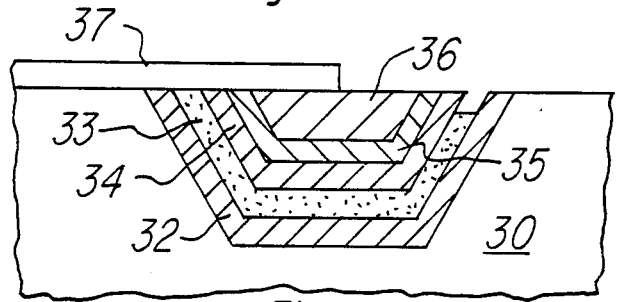
Figure 3C:
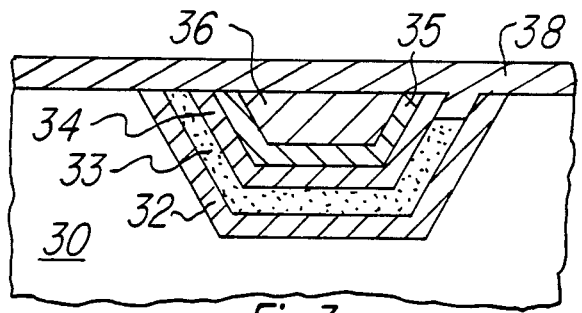
Figure 3D:
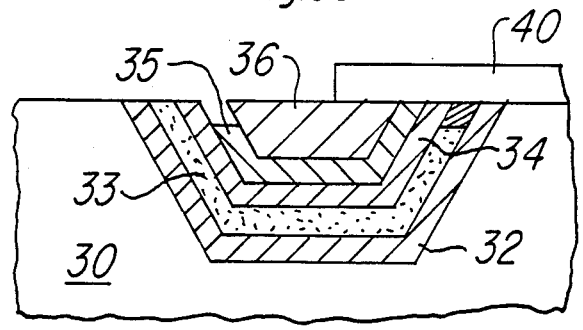
Figure 3E:
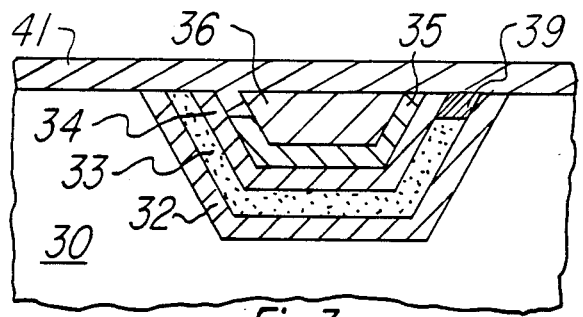
Figure 3F:
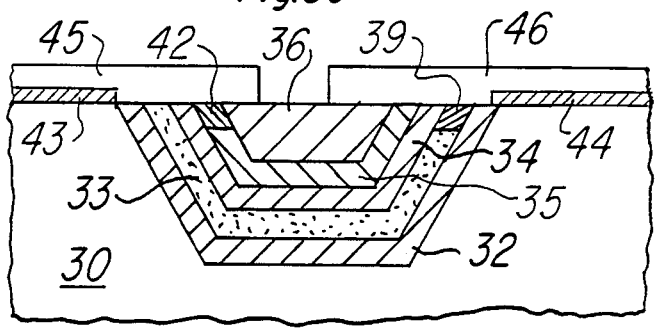

FIGS. 3A through 3G are side view schematic diagrams depicting the processing steps necessary to fabricate another embodiment of this invention. Cavity 40 is formed on the surface of substrate 30 using techniques well known in the art such as orientation dependent etching. Dielectric layers 32, 34 and 36 and conductive layers 33 and 35 are then formed on the surface of substrate 30 using a conformal deposition techniques such as chemical vapor deposition. Dielectric layers 32, 34 and 36 and conductive layers 33 and 35 are then etched back to be coplanar with the surface of substrate 30 using a technique such as photoresist fill and etch-back or other techniques well known in the art. Conductive layer 33 is then selectively etched on one side while mask 37 protects the other side of conductive layer 33. This provides the structure as shown in FIG. 3B. Dielectric layer 38 is then formed on the surface of substrate 30 using a technique well known in the art such as chemical vapor deposition. Dielectric layer 38 is then etched leaving dielectric plug 39 as shown in FIG. 3C. The left-hand side of the stack composed of dielectric layers 32, 34 and 36 and conductive layers 33 and 35, of conductive layer 35 is then selectively etched to provide the structure shown in FIG. 3D. Dielectric layer 41 is then deposited by using techniques well known in the art such as chemical vapor deposition to provide the structure as shown in FIG. 3E. Dielectric layer 41 is then etched back to provide dielectric plug 42 as shown in FIG. 3F. Insulator layers 43 and 44 are then formed on the surface of substrate 30 using techniques well known in the art as shown in FIG. 3G. Conductive contacts 45 and 46 are then formed on the surface of the capacitor stack and insulator layers 43 and 44, thus providing an interleaved capacitor formed in a cavity in the surface of substrate 30. It is to be understood that other embodiments of the capacitor formed using the techniques described with regards to FIGS. 3A through 3G may provide more capacitor plates than conductive layers 33 and 35, thus providing a fully interleaved capacitor having multiple plates for increased capacitance. The structure described with regards to FIGS. 3A through 3F was chosen for illustrative purposes only and for simplicity of explanation.

Figure 4:
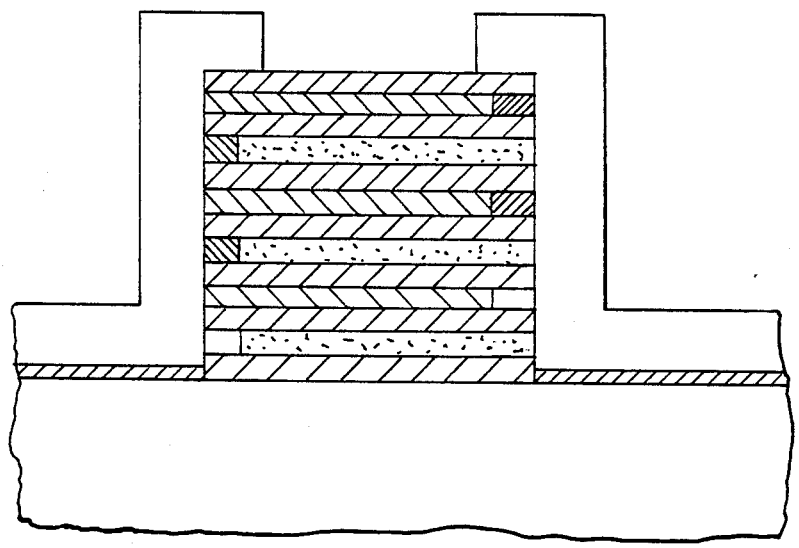
FIG. 4 is a side view schematic diagram depicting one embodiment of the invention including multiple interleaved plates.

FIG. 4 is a side view schematic diagram of another embodiment of the present invention. The shown embodiment includes multiple interleaved capacitor plates to provide additional capacitance over the normal two plate capacitor. Each additional plate increases the capacitance by an additive factor. For example, a three plate capacitor provides approximately twice (1—1) the capacitance of a two plate capacitor. A four plate capacitor provides three (1—1—1) times the capacitance of a two plate capacitor.

TECHNICAL ADVANTAGES

The present invention provides increased capacitance over techniques used in the prior art while occupying the same of similar surface area on the integrated circuit. Thus the present invention provides a more dense integrated circuit while providing the high levels of capacitance necessary for circuit operation of certain circuits.

We claim:

1. An integrated circuit having a capacitor, said capacitor comprising:
   a first plurality of conductive plates of a first conductive material, interleaved but insulated from a second plurality of conductive plates of a second conductive material different from said first conductive material;
   a first electrical contact at the edge of said interleaved plates connected to said first plurality of conductive plates but insulated from said second plurality of conductive plates;
   a second electrical contact at the edge of said interleaved plates connected to said second plurality of conductive plates but insulated from said first plurality of conductive plates; and
   a separate, unitary dielectric plate between each interleaved pair of said first plurality of conductive plates and said second plurality of conductive plates.

2. An integrated circuit as in claim 1 wherein said dielectric plate is silicon dioxide.

3. The integrated circuit of claim 1 wherein:
   said first and second conductive materials are selectively etchable relative to each other and to said dielectric material.

4. The integrated circuit of claim 1 further comprising:
   a substrate having a cavity formed therein, wherein said capacitor is formed within said cavity.

5. An integrated circuit having a semiconductor substrate with a substantially flat surface oriented along a horizontal direction for forming circuit components thereon, said integrated circuit further including a capacitor, said capacitor comprising:

a plurality of first conductive plates vertically stacked above the substrate, each plate having a first edge for electrical connection;

a plurality of second conductive plates interleaved with the plurality of first conductive plates, each second plate including a second edge for electrical connection extending along the horizontal direction beyond the first conductive plates to form a recessed space adjacent each first conductive plate and between the second conductive plates, the first edge of each first plate extending along the horizontal direction beyond the second conductive plates to form a recessed space adjacent each second conductive plate and between the first conductive plates;

a plurality of separate, unitary dielectric layers positioned between the interleaved first and second plates;

insulating means positioned in the recessed spaces for electrically isolating the first edges from the second conductive plates and for electrically isolating the second edges from the first conductive plates;

first conductor means, formed along the first edges and insulated from the second conductive plates, for providing electrical contact between the first conductive plates; and second conductor means, formed along the second edges and insulated from the first conductive plates, for providing electrical contact between the second conductive plates.

6. The integrated circuit of claim 5 wherein the first capacitor edges are substantially in vertical alignment with respect to the horizontal direction.

7. The integrated circuit of claim 6 wherein the first capacitor edges are aligned in a first plane transverse to the horizontal direction and the second capacitor edges are substantially in vertical alignment with respect to the horizontal direction forming a second plane parallel to the first plane.

8. The integrated circuit of claim 5 wherein said first and second conductor means further provide means for coupling said capacitor to other circuit components.

9. An integrated circuit having a capacitor, said capacitor comprising:

a semiconductor substrate having a cavity formed along a substantially flat surface;

a plurality of layered first conductive plates positioned in the cavity, each plate having a first edge for electrical connection with other first plates;

a plurality of layered second conductive plates interleaved with the plurality of first conductive plates, each second plate including a second edge for electrical connection, each second edge extending beyond the first conductive plates to form a recessed space adjacent a first plate and between the second conductive plates, the first edge of each first plate extending beyond the second conductive plates to form a recessed space adjacent a second plate and between the first conductive plates;

a plurality of separate, unitary dielectric layers positioned to insulate the interleaved first and second plates from one another;

insulating means positioned in the recessed spaces for electrically isolating the first edges from the second conductive plates and for electrically isolating the second edges from the first conductive plates;

first conductor means, formed along the first edges and insulated from the second conductive plates, for providing electrical contact between the first conductive plates; and second conductor means, formed along the second edges and insulated from the first conductive plates, for providing electrical contact between the second conductive plates.

10. The integrated circuit of claim 9 wherein the first and second plate edges are substantially in parallel alignment with the substrate surface.

11. The integrated circuit of claim 9 wherein said first and second conductor means further provide means for coupling said capacitor to other circuit components.

* * * * *